(12) United States Patent
Lee

(10) Patent No.: US 9,847,240 B2
(45) Date of Patent: Dec. 19, 2017

(54) CONSTANT MASS FLOW MULTI-LEVEL COOLANT PATH ELECTROSTATIC CHUCK

(71) Applicant: Axcelis Technologies, Inc., Beverly, MA (US)

(72) Inventor: William Davis Lee, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 727 days.

(21) Appl. No.: 14/178,795

(22) Filed: Feb. 12, 2014

(65) Prior Publication Data

US 2015/0228515 A1   Aug. 13, 2015

(51) Int. Cl.

| | |
|---|---|
| *F28F 7/00* | (2006.01) |
| *H01L 21/67* | (2006.01) |
| *H01L 21/683* | (2006.01) |
| *H01L 23/46* | (2006.01) |
| *F28D 1/06* | (2006.01) |
| *H01L 23/40* | (2006.01) |
| *F28D 21/00* | (2006.01) |

(52) U.S. Cl.
CPC ......... *H01L 21/67109* (2013.01); *F28D 1/06* (2013.01); *H01L 21/6831* (2013.01); *H01L 23/46* (2013.01); *F28D 2021/0029* (2013.01); *H01L 23/40* (2013.01)

(58) Field of Classification Search
CPC .......... H01L 21/67109; H01L 21/6831; H01L 21/28176; H01L 21/477; H01L 23/40; H01L 23/46; H01L 23/473; F28D 1/06; F28D 2021/0029
See application file for complete search history.

(56) References Cited

U.S. PATENT DOCUMENTS

| | | |
|---|---|---|
| 6,033,478 A | 3/2000 | Kholodenko |
| 7,221,553 B2 | 5/2007 | Nguyen et al. |
| 2009/0159566 A1 | 6/2009 | Brillhart et al. |
| 2012/0016508 A1* | 1/2012 | Matsuzaki ........ H01J 37/32449 700/108 |
| 2014/0150246 A1* | 6/2014 | Johnson .............. H01L 21/6831 29/559 |

* cited by examiner

*Primary Examiner* — Len Tran
*Assistant Examiner* — Jon T Schermerhorn
(74) *Attorney, Agent, or Firm* — Eschweiler & Potashnik, LLC

(57) ABSTRACT

A workpiece support has a vessel having a top interior wall and a bottom interior wall. An interior cavity is defined between the top interior wall and bottom interior wall, wherein a support surface configured to support a workpiece. A plate is positioned within the interior cavity, dividing the interior cavity into a top cavity and a bottom cavity. The top and bottom cavities are fluidly coupled about a periphery of the plate. A first taper defined in one or more of the top interior wall and a top portion of the plate provides a substantially constant volume across a radial cross-section of the top cavity. A second taper defined in one or more of the bottom interior wall and a bottom portion of the plate provides a substantially constant volume across a radial cross-section of the bottom cavity. First and second ports fluidly couple the top and bottom cavities to respective first and second fluid channels.

13 Claims, 5 Drawing Sheets

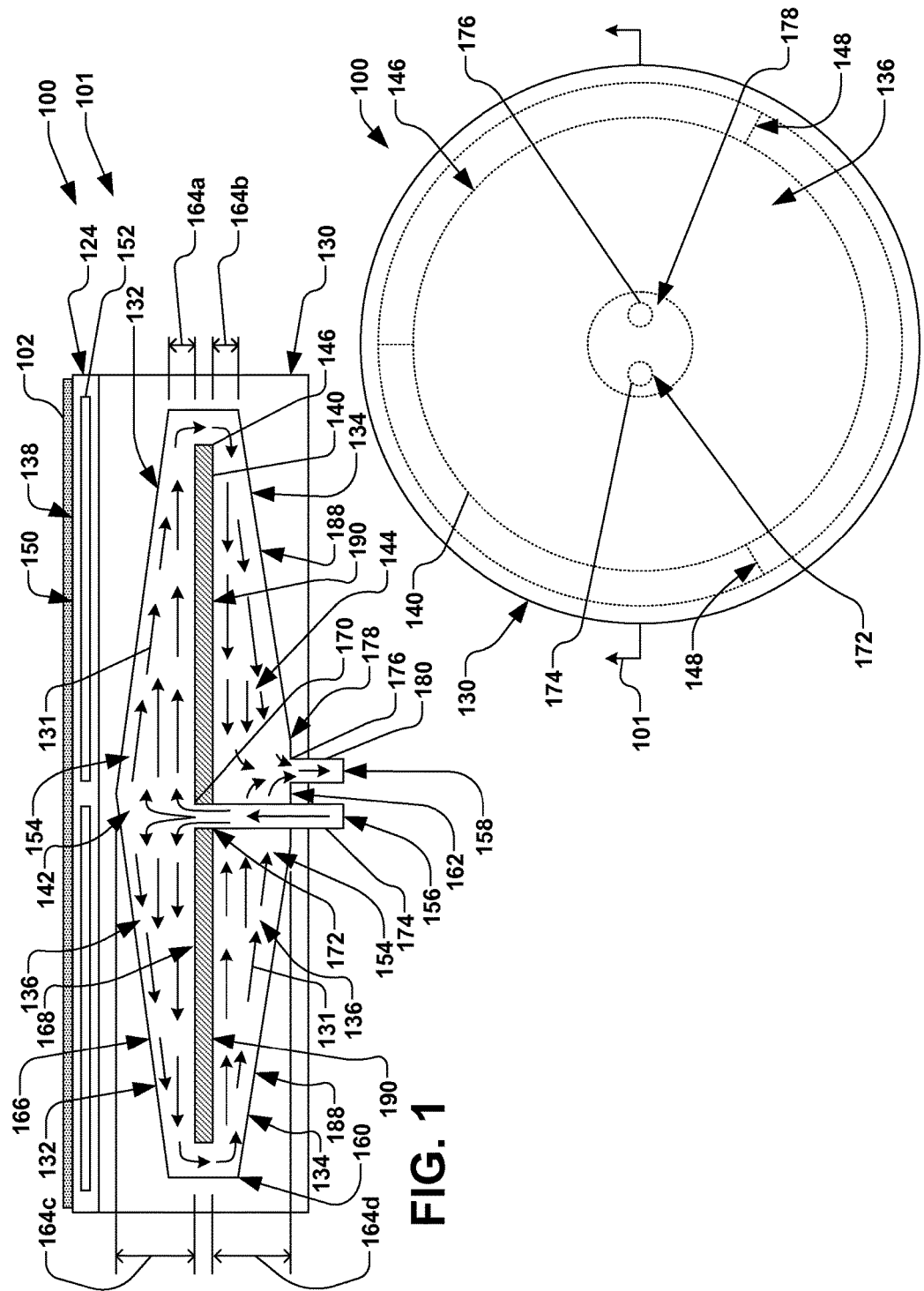

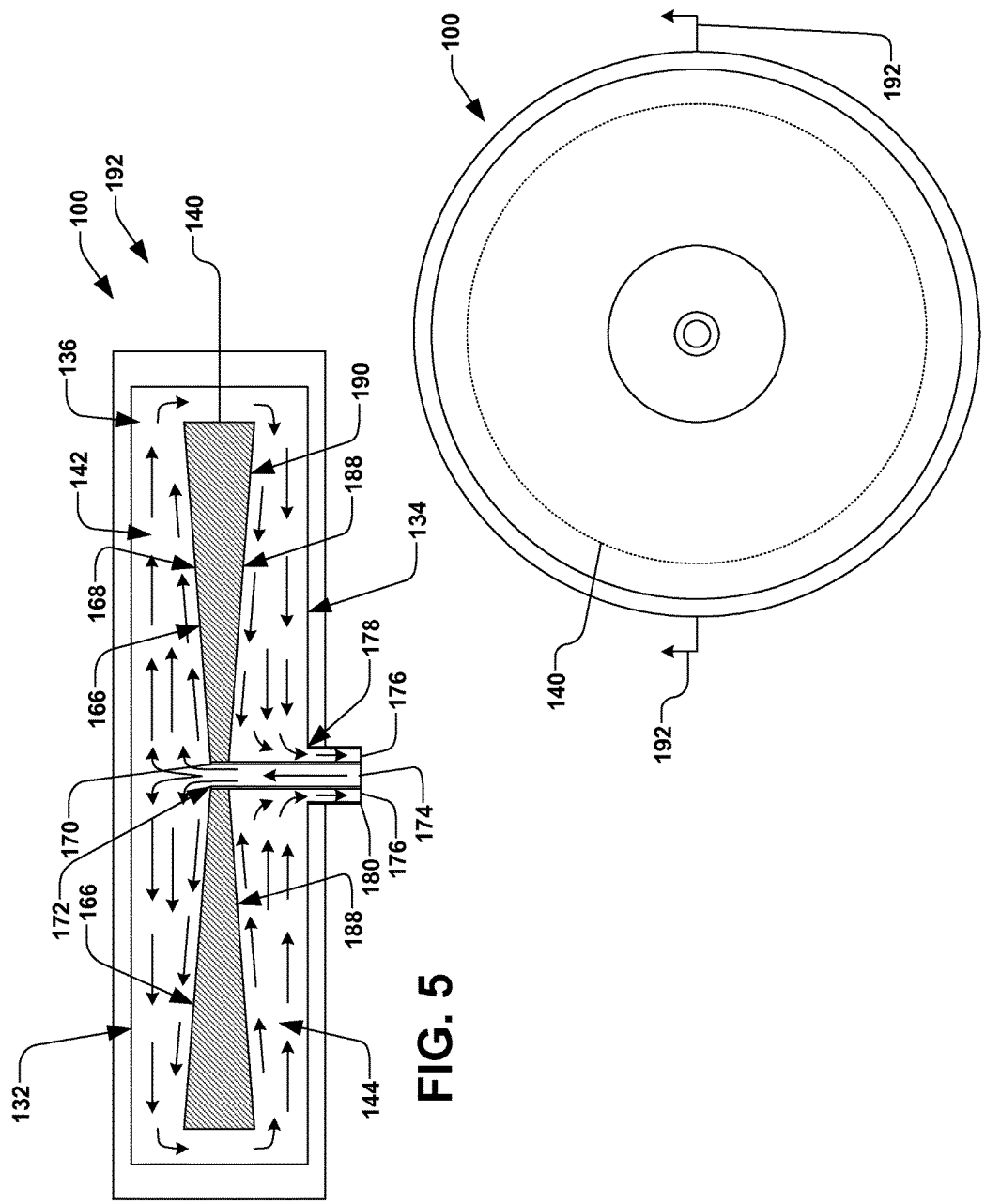

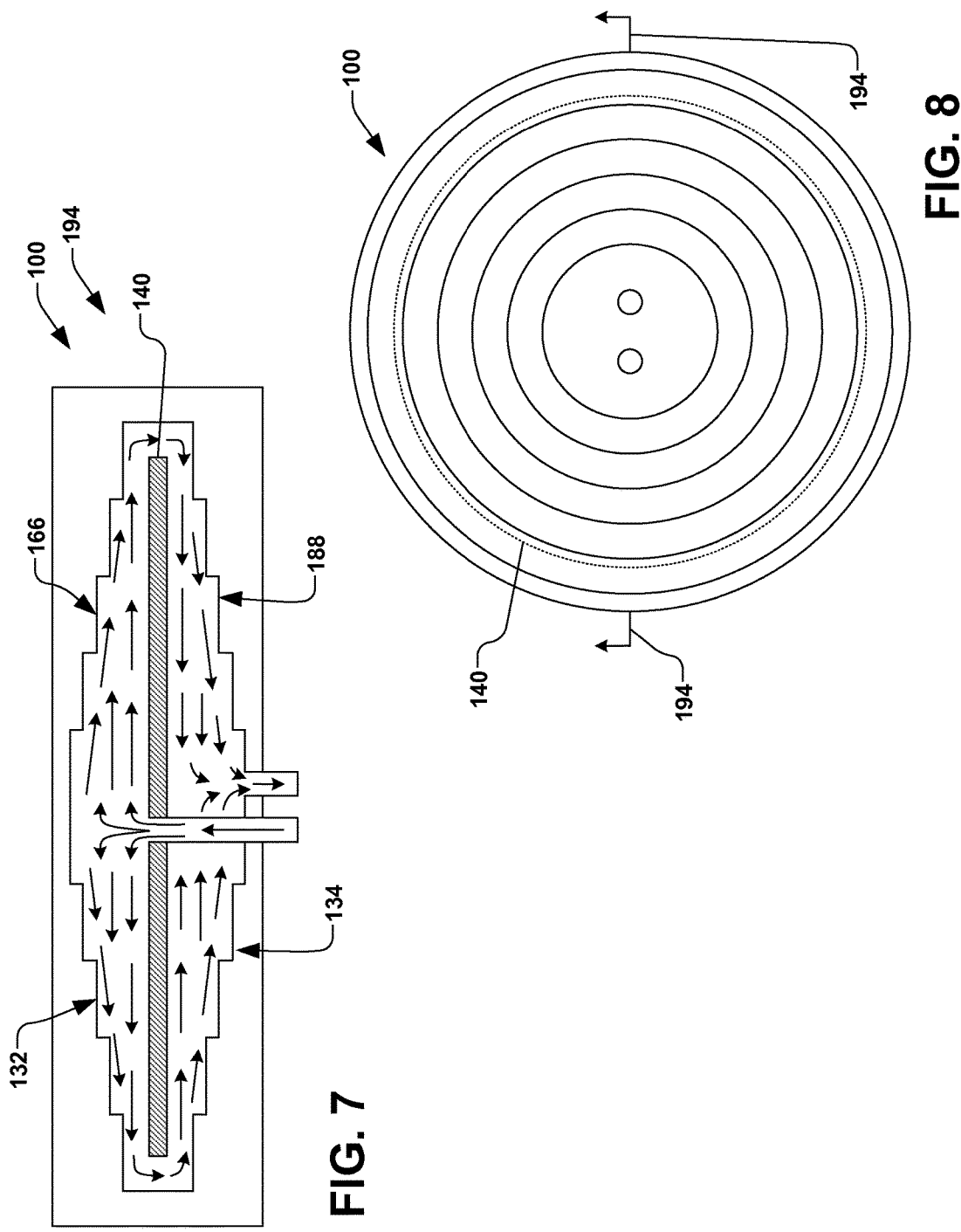

CONSTANT MASS FLOW MULTI-LEVEL COOLANT PATH ELECTROSTATIC CHUCK

TECHNICAL FIELD

The present disclosure relates generally to workpiece carriers and more specifically to a electrostatic chuck configured to flow coolant therethrough at a generally constant mass flow rate.

BACKGROUND

Workpiece supports are often utilized in the semiconductor industry for supporting and clamping workpieces or substrates during plasma-based or vacuum-based semiconductor processes such as ion implantation, etching, chemical vapor deposition (CVD), etc. Electrostatic clamps (ESCs), for example, implement electrostatic clamping forces between the workpiece and the ESC to electrostatically attract the workpiece to a clamping surface of the ESC during processing. It is often desirable to cool or heat the workpiece during processing, wherein a fluid is flowed through a fluid path within the ESC in order to provide the cooling or heating of the workpiece while the workpiece resides on the ESC.

SUMMARY

The present disclosure details a system, apparatus, and method for uniformly cooling and/or heating a workpiece positioned on a workpiece support in a semiconductor processing system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

in accordance with one exemplary aspect, a workpiece support is provided, wherein the workpiece support comprises a vessel having a top interior wall and a bottom interior wall. The top interior wall is disposed opposite the bottom interior wall, therein defining an interior cavity between the top interior wall and bottom interior wall. The vessel further comprises a support surface configured to support a workpiece thereon.

A plate is positioned within the interior cavity, wherein the plate generally divides the interior cavity into a top cavity defined between the plate and the top interior wall and a bottom cavity defined between the plate and the bottom interior wall. In one example, the top cavity and bottom cavity are fluidly coupled to one another about a periphery of the plate.

A first taper is further defined in one or more of the top interior wall and a top portion of the plate, wherein the first taper provides a substantially constant volume across a radial cross-section of the top cavity. In one example, a second taper is also defined in one or more of the bottom interior wall and a bottom portion of the plate, wherein the second taper provides a substantially constant volume across a radial cross-section of the bottom cavity.

A first port is defined in a central portion of the plate, wherein the first port fluidly couples the top cavity to a first fluid channel. A second port is further defined in bottom portion of the vessel, wherein the second port fluidly couples the bottom cavity to a second fluid channel.

In one example, a pump is also provided, wherein an inlet of the pump is fluidly coupled to one of the first fluid channel and second fluid channel, and wherein an outlet of the pump is fluidly coupled to the other one of the first fluid channel and second fluid channel. A thermal unit is further fluidly coupled to one of the first fluid channel and second fluid channel, wherein the thermal unit comprises one or more of a heater and chiller configured to respectively heat and chill a fluid disposed within the first fluid channel and second fluid channel.

In another example, a controller is further configured to control a thermal transfer between the workpiece and the vessel based on a control of one or more of the pump and the thermal unit.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a cross-sectional view of an exemplary workpiece support in accordance with several aspects of the present disclosure.

FIG. 2 is a plan view of the exemplary workpiece support of FIG. 1.

FIG. 5 is a cross-sectional view of another exemplary workpiece support in accordance with several aspects of the present disclosure.

FIG. 6 is a plan view of the exemplary workpiece support of FIG. 5.

FIG. 7 is a cross-sectional view of yet another exemplary workpiece support in accordance with several aspects of the present disclosure.

FIG. 8 is a plan view of the exemplary workpiece support of FIG. 7.

DETAILED DESCRIPTION

Figure 3:
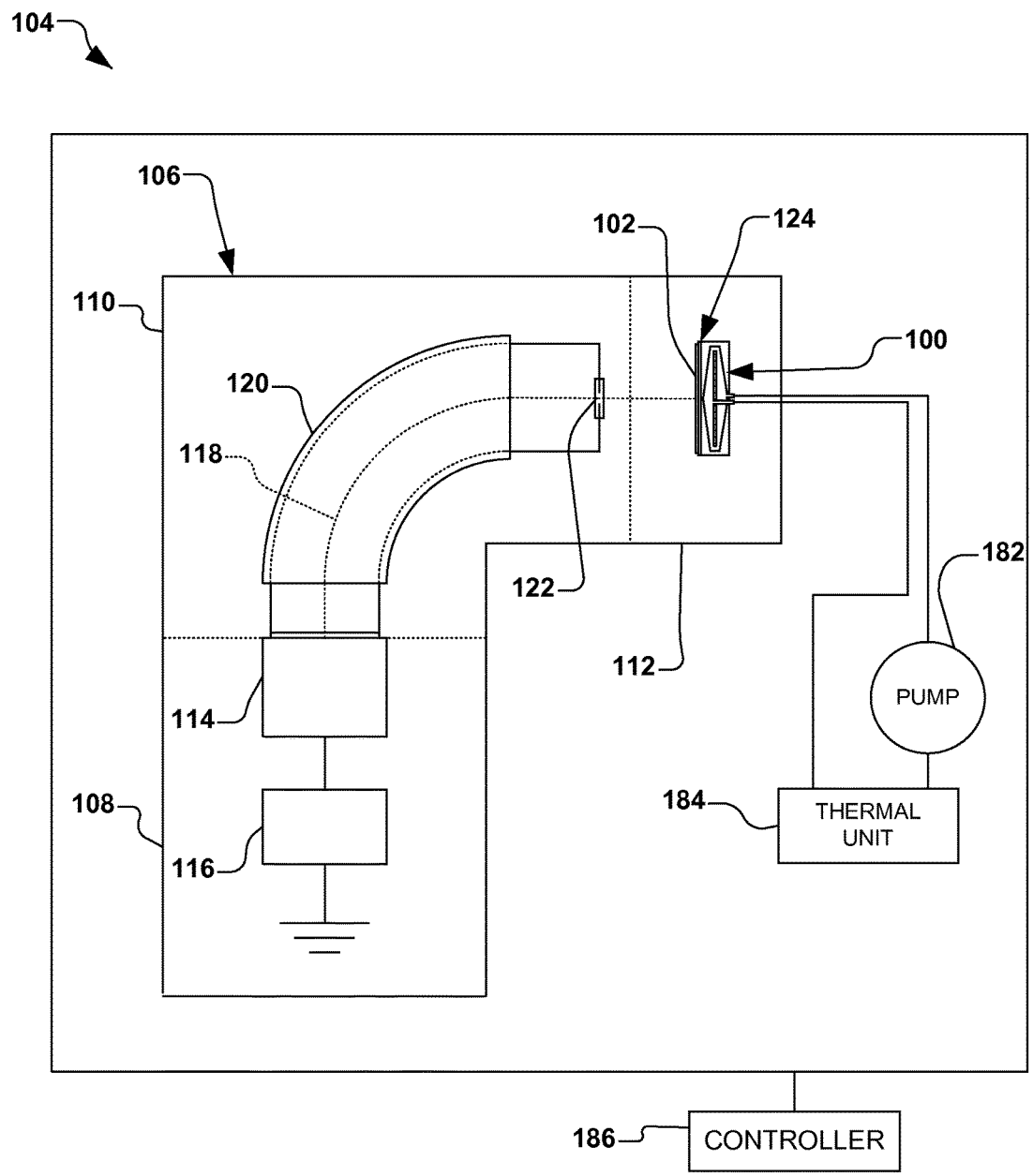
FIG. 3 is a block diagram of an exemplary processing system comprising an ion implantation system in accordance with several aspects of the present disclosure.

In some semiconductor processes, such as ion implantation processes, it can be desirable to provide a thermal path (e.g., a cooling path or a heating path) between a workpiece (e.g., a semiconductor wafer) and a support that holds the workpiece during processing in order to maintain a predetermined temperature at the workpiece. The present disclosure provides a workpiece support having a fluid disposed therein, wherein a flow of the fluid within the workpiece support is maintained at a substantially constant mass flow rate as the fluid travels with respect to a surface of the workpiece.

The present disclosure is thus directed generally toward a system, apparatus, and method for supporting workpieces and transferring thermal energy between a workpiece and a workpiece support in a semiconductor processing system. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Referring now to the Figures, FIGS. 1-2 illustrates an exemplary workpiece support 100 having a multilevel coolant flow in accordance with the present disclosure, wherein FIG. 1 illustrates a cross-sectional view 101 of the workpiece support of FIG. 2. The workpiece support 100, for example, is configured to support a workpiece 102 illustrated in FIG. 1 concurrent with the workpiece undergoing semiconductor processing. Accordingly, the workpiece support 100 of the present disclosure is configured to transfer heat between the workpiece 102 and the workpiece support concurrent with the semiconductor processing, such as removing heat from the workpiece concurrent with an ion implantation or other processing that provides heat to the workpiece. Alternatively, the workpiece support 100 can be configured to provide heat to the workpiece 102 before, during, or after semiconductor processing. As such, the workpiece support 100 is configured to provide a thermal transfer between the workpiece 102 and the workpiece support.

In order to gain a further understanding of the present disclosure, FIG. 3 illustrates an exemplary processing system 104. The processing system 104 in the present example comprises an ion implantation system 106, however various other types of processing systems are also contemplated, such as plasma processing systems, reactive ion etching (RIE) systems, or other semiconductor processing systems. The ion implantation system 106, for example, comprises a terminal 108, a beamline assembly 110, and an end station 112.

Generally speaking, an ion source 114 in the terminal 108 is coupled to a power supply 116 to ionize a dopant gas into a plurality of ions and to form an ion beam 118. The ion beam 118 in the present example is directed through a beam-steering apparatus 120, and out an aperture 122 towards the end station 112. The ion beam 118 of the present disclosure can take a variety of forms, such as a pencil or spot beam, a ribbon beam, a scanned beam, or any other form in which ions are directed toward end station 112, and all such forms are contemplated as falling within the scope of the disclosure. In the end station 112, the ion beam 118 bombards the workpiece 102 (e.g., a semiconductor such as a silicon wafer, a display panel, etc.), which resides on the workpiece support 100. Once embedded into the lattice of the workpiece 102, the implanted ions change the physical and/or chemical properties of the workpiece. Because of this, ion implantation is used in semiconductor device fabrication and in metal finishing, as well as various applications in materials science research.

During an ion implantation, energy can build up on the workpiece 102 in the form of heat, as the charged ions collide with the workpiece. Absent countermeasures, such heat can potentially warp or crack the workpiece 102, which may render the workpiece worthless (or significantly less valuable) in some implementations. Excess heat and the accompanied temperature rise, for example, can be deleterious to the process, wherein precise temperature control is desired. In one example, excess heat can further cause a dosage of ions delivered to the workpiece 102 to differ from that which is desired, thus potentially altering a desired functionality of the workpiece. Alternatively, it may be desirable to implant ions at a temperature below or above an ambient temperature, such as to allow for desirable amorphization of the surface of the workpiece 102 enabling ultra shallow junction formation in advanced CMOS integrated circuit device manufacturing. In such cases, cooling of the workpiece 102 is desirable. In other circumstances, it is desirable to further heat the workpiece 102 during implantation or other processing in order to aid in processing (e.g., such as a high-temperature implantation into silicon carbide).

Thus in accordance with the present disclosure, the workpiece support 100 is configured to both support the workpiece 102 and to selectively cool, heat, or otherwise maintain a predetermined temperature on the workpiece before, during, and/or after processing of the workpiece, such as concurrent with the workpiece being subjected to the ion beam 118. As such, the workpiece support 100 in the present example can be thus configured to support and cool and/or heat the workpiece 102. The workpiece support 100, in one example, further comprises an electrostatic clamp 124 configured to maintain a position of the workpiece 102 (e.g., electrostatically clamp the workpiece to the workpiece support), wherein the workpiece support is further configured to cool and/or heat the workpiece concurrent with processing.

According to one example, the workpiece support 100 comprises a vessel 130 configured to provide a flow of a fluid therethrough. The fluid, for example, can comprise a liquid or a gas, and can be chilled or heated as desired, as will be discussed in further detail hereafter. As illustrated in FIGS. 1-2, the workpiece support 100 provides an advantageous fluid flow (e.g., indicated by arrows 131), wherein supply and return flows occur on different planes. Thus, a substantially radial flow of the fluid can be achieved, wherein the return path is directed radially on a different level than the supply path (e.g., either above or below the supply path). The present disclosure advantageously provides a fluid mass flow rate that is substantially constant throughout the flow of the fluid through the workpiece support via a variable cross sectional area of the fluid path, as will now be discussed in further detail.

According to one example, the vessel 130 is configured to provide a flow of the fluid therethrough. The vessel 130, in one example, is generally hollow and comprises a top interior wall 132 and a bottom interior wall 134, wherein the top interior wall is disposed generally opposite to the bottom interior wall, therein defining an interior cavity 136 between the top interior wall and bottom interior wall. The vessel 130, for example, further comprises a support surface 138 configured to support the workpiece 102 thereon, wherein the support surface is configured to facilitate heat transfer between the workpiece and the vessel. As such, the workpiece support 100 is configured to transfer heat between the workpiece 102 and the fluid via thermal conduction path through the top interior wall 132 to the support surface 138.

In accordance with one example, a plate 140 is positioned within the interior cavity 136 of the vessel 104, wherein the plate generally divides the interior cavity into a top cavity 142 defined between the plate and the top interior wall 132 and a bottom cavity 144 defined between the plate and the bottom interior wall 134. In the present example, the top cavity 142 and bottom cavity 144 are fluidly coupled to one another about a periphery 146 of the plate 140, as illustrated in further detail in FIG. 2. One or more support structures 148, such as rods, pins, fins, or other structures, can be provided to generally secure and support the plate 140 within the interior cavity 136 of the vessel 130.

According to another example, the workpiece support 100 of FIG. 1 comprises the electrostatic clamp 124 thermally coupled thereto, wherein a clamping surface 150 of the electrostatic clamp generally defines the support surface 138. The electrostatic clamp 124, for example, comprises one or more electrodes 152 configured to electrostatically attract the workpiece 102 to the support surface 138, as will be understood to one skilled in the art. The support surface 138 of the present example is generally planar, however, the present disclosure also contemplates the support surface comprising a textured or depressed surface, wherein a conductive gas can be introduced between the workpiece 102 and the support surface to aid in thermal conduction between the workpiece support 100 and the workpiece.

In accordance with the present disclosure, the workpiece support 100 thus provides the flow of fluid to occur on separate levels through a channel 154 defined at least by the interior cavity 136 of the vessel 130, wherein fluid is supplied on one level and returned on another level. As illustrated in the example of FIG. 1, a supply path 156 and a return path 158 are provided, wherein the supply path and return path are connected proximate to one or more of an edge 160 and a center 162 of the interior cavity 136 in order to allow fluid to flow from the supply path to the return path. It should be noted that the supply path 156 and return path 158 can be reversed, based on desired performance of the workpiece support 100.

As illustrated in FIG. 1, a height 164a-164d of the channel 154 is variable as a function of radius, wherein the variation in the height advantageously compensates for the increasing cross sectional area. In the present example, the workpiece support 100 and plate 140 are substantially round and disk-shaped, wherein the fluid flow along the supply path 156 and return path 158 will transfer heat between the fluid and the workpiece 102 via convective heat transfer. The convective heat transfer coefficient, $h_x$, depends on the flow velocity as:

$$h_x \propto Nu_x = f(Re, Pr) \quad (1)$$

through the Reynolds number Re. The mass flow, $\dot{m}$, through the workpiece support 100 can be described by:

$$\dot{m} = \rho V A \quad (2),$$

where $\rho$ is the density of the fluid flowing through the channel 154, V is the velocity of the fluid flow, and A is the cross sectional area of the channel. In a channel 154 that approximates a disk with substantially radial flow, the cross sectional area A of the channel 154 will increase with radius as:

$$A = 2\pi r h \quad (3),$$

where r is radial distance of the channel in the disk and h is the height of the channel. In one example, a substantially constant cross sectional area and mass flow can be attained by sizing the channel 154 such that the height is inversely proportional to the radius (1/r). Practically, however, such a design may be difficult to attain, considering the center 162 of the interior cavity 136 would lead to an infinite height. The present disclosure advantageously provides a taper or stepping of the channel 154 to a smaller and smaller height as the fluid flows radially outward from the center 162 of the interior cavity 136.

Thus, in accordance with some examples of the present disclosure, a first taper 166 is defined in one or more of the top interior wall 132 and a top portion 168 of the plate 140, wherein the first taper provides a substantially constant volume across a radial cross-section of the top cavity 142. Accordingly, a substantially constant mass flow of the fluid is advantageously attained across the radius of the interior cavity 136. The first taper 166, in one example, is generally linear and is defined in the top interior wall 132 of the vessel 130, as illustrated in FIGS. 1-2, wherein the top cavity 142 is generally conical.

Figure 4:
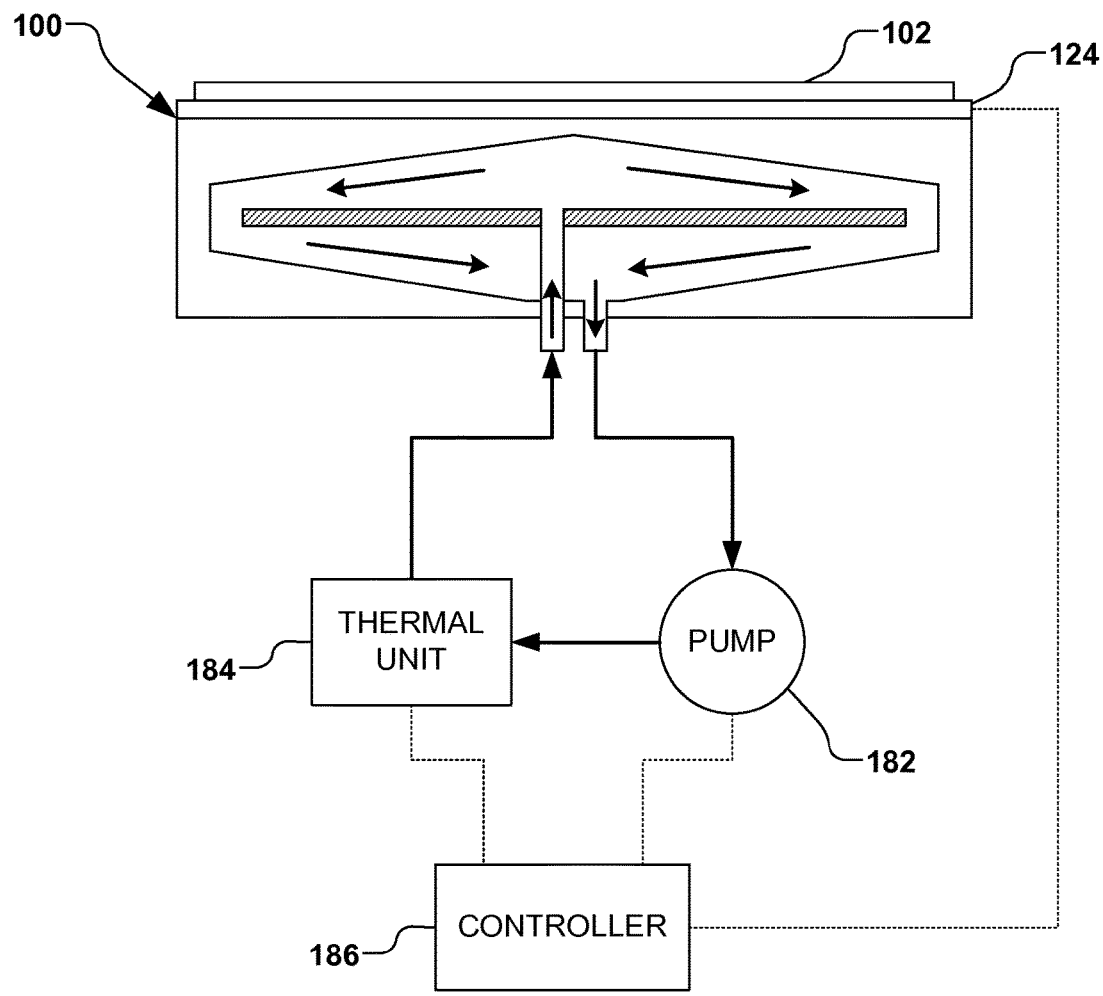
FIG. 4 is a block diagram of an exemplary workpiece support system in accordance with several aspects of the present disclosure.

A first port 170 is further defined in a central portion 172 of the plate 140, wherein the first port fluidly couples the top cavity 142 to a first fluid channel 174. A second port 176 is also defined in a bottom portion 178 of the vessel 130, wherein the second port fluidly couples the bottom cavity 144 to a second fluid channel 180. As illustrated in FIGS. 3-4, a pump 182 and thermal unit 184 are further fluidly coupled to the first fluid channel 174 and second fluid channel 180. The thermal unit 184 is configured to heat and/or cool the fluid, wherein the fluid is circulated through workpiece support 100 and thermal unit via the pump 182, therein advantageously heating and/or cooling the workpiece 102 via a substantially constant mass flow through the workpiece support 100. A controller 186 is further provided in FIGS. 3-4, wherein the controller is configured to control one or more of the thermal unit 184, workpiece support 100

(e.g., the electrostatic clamp 124), the pump 182, and/or various other features of the processing system 104 of FIG. 3.

In accordance with another example, a second taper 188 is defined in one or more of the bottom interior wall 134 and a bottom portion 190 of the plate 140, wherein the second taper further provides a substantially constant volume across a radial cross-section of the interior cavity 136. Accordingly, a substantially constant mass flow of the fluid is further advantageously attained across the radius of the interior cavity 136. The second taper 188, for example, is also generally linear, wherein the bottom cavity 144 is generally conical. In one example, the first taper 166 and second taper 188 are generally mirror images to one another.

In accordance with another example, as illustrated in FIGS. 5-6, the first taper 166 (illustrated in cross-section 192 of FIG. 5) is generally linear and defined by the top portion 168 of the plate 140, and the second taper 188 is defined by the bottom portion 190 of the plate. Similar to the example of FIGS. 1-2, in the example of FIGS. 5-6, the first port 170 is also defined in the central portion 172 of the plate 140 and fluidly couples the top cavity 142 to the first fluid channel 174. The second port 176 is also defined in the bottom portion 178 of the vessel 130, wherein the second port fluidly couples the bottom cavity 144 to the second fluid channel 180. However, as illustrated in FIGS. 5-6, the first fluid channel 174 and second fluid channel 180 are coaxial. Being coaxial, an advantageous flow of the fluid through the top cavity 142 and bottom cavity 144 and the first fluid channel 174 and second fluid channel 180 can be attained.

FIGS. 7-8 illustrate another example of the first taper 166 (illustrated in cross-section 194 of FIG. 7) is generally stepped and defined by the top interior wall 132 of the vessel 130, and the second taper 188 is also generally stepped and defined by the bottom interior wall 134 of the vessel. It should be noted that the first taper 166 and second taper 188 can also be provided in a generally stepped manner in the plate 140.

In accordance with another example of the present disclosure, the heat transfer coefficient is either generally constant, or changes in a favorable way, in order to compensate for non-uniform temperatures or power loads during processing. In one example, the first fluid channel 174 and second fluid channel 180 (e.g., including the top cavity 142 and bottom cavity 144 are shaped similar to one another, thus achieving an advantageous fluid flow. Alternatively, the top cavity 142 and bottom cavity 144 can vary from one another in order to provide varied fluid flow at predetermined radial locations (e.g., when a need to additionally heat or cool a specific region is desired). Furthermore, while one direction of flow is illustrated in the Figures, it is to be understood that a flow of the fluid can be reversed as desired.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A workpiece support, comprising:
   a vessel comprising a top interior wall and a bottom interior wall, wherein the top interior wall is disposed opposite the bottom interior wall, therein defining an interior cavity between the top interior wall and bottom interior wall, wherein the vessel further comprises a support surface configured to support a workpiece thereon;
   a plate positioned within the interior cavity, wherein the plate divides the interior cavity into a top cavity defined between the plate and the top interior wall and a bottom cavity defined between the plate and the bottom interior wall, and wherein the top cavity and bottom cavity are fluidly coupled to one another about a periphery of the plate;
   a first taper defined in one or more of the top interior wall and a top portion of the plate, wherein a first height between the top portion of the plate and the top interior wall decreases as a function of a radius from a center of the interior cavity toward the periphery of the plate;
   a second taper defined in one or more of the bottom interior wall and a bottom portion of the plate, wherein a second height between the bottom portion of the plate and the bottom interior wall decreases as a function of the radius from the center of the interior cavity toward the periphery of the plate;
   a first port defined in a central portion of the plate, wherein the first port fluidly couples the top cavity to a first fluid channel; and
   a second port defined in bottom portion of the vessel, wherein the second port fluidly couples the bottom cavity to a second fluid channel.

2. The workpiece support of claim 1, wherein the first taper is linear.

3. The workpiece support of claim 1, wherein the top cavity is substantially conical.

4. The workpiece support of claim 1, wherein the support surface is substantially planar.

5. The workpiece support of claim 1, wherein the vessel comprises an electrostatic clamp thermally coupled thereto, wherein a clamping surface of the electrostatic clamp substantially defines the support surface.

6. The workpiece support of claim 1, wherein a thermal conduction path is defined between the support surface and the interior cavity.

7. The workpiece support of claim 1, wherein a fluid path is defined within the interior cavity, wherein the first taper and second taper provide a substantially constant mass flow of a fluid through the interior cavity.

8. A workpiece support, comprising:
   a vessel, wherein the vessel is substantially cylindrical and comprises a top interior wall and a bottom interior wall, wherein an interior cavity is defined between the top interior wall and bottom interior wall, and wherein a support surface is associated with a top exterior portion of the vessel, wherein the support surface is configured to support a workpiece thereon;

a plate defined within the interior cavity, wherein the plate defines a top cavity between a top portion of the plate and the top interior wall and a bottom cavity between a bottom portion of the plate and the bottom interior wall, and wherein the top cavity and bottom cavity are fluidly coupled to one another about a periphery of the plate;

a first taper defined in one or more of the top interior wall and top portion of the plate, wherein a first height between the top portion of the plate and the top interior wall decreases as a function of a radius from a center of the interior cavity toward the periphery of the plate;

a second taper defined in one or more of the bottom interior wall and bottom portion of the plate, wherein a second height between the bottom portion of the plate and the bottom interior wall decreases as a function of the radius from the center of the interior cavity toward the periphery of the plate;

a first port defined in a central portion of the plate, wherein the first port fluidly couples the top cavity to a first fluid channel; and a second port defined in a bottom portion of the vessel, wherein the second port fluidly couples the top cavity to a second fluid channel.

9. The workpiece support of claim 8, further comprising an electrostatic clamp, wherein a clamping surface of the electrostatic clamp substantially defines the support surface.

10. A thermal workpiece support system, comprising:
a vessel comprising a top interior wall and a bottom interior wall, therein defining an interior cavity between the top interior wall and bottom interior wall, wherein the vessel further comprises a support surface configured to support a workpiece thereon;

a plate positioned within the interior cavity, wherein the plate divides the interior cavity into a top cavity defined between the plate and the top interior wall and a bottom cavity defined between the plate and the bottom interior wall, and wherein the top cavity and bottom cavity are fluidly coupled to one another about a periphery of the plate;

a first taper defined in one or more of the top interior wall and a top portion of the plate, wherein a first height between the top portion of the plate and the top interior wall decreases as a function of a radius from a center of the interior cavity toward the periphery of the plate;

a second taper defined in one or more of the bottom interior wall and a bottom portion of the plate, wherein a second height between the bottom portion of the plate and the bottom interior wall decreases as a function of the radius from the center of the interior cavity toward the periphery of the plate;

a first port defined in a central portion of the plate, wherein the first port fluidly couples the top cavity to a first fluid channel;

a second port defined in bottom portion of the vessel, wherein the second port fluidly couples the bottom cavity to a second fluid channel;

a pump, wherein an inlet of the pump is fluidly coupled to one of the first fluid channel and second fluid channel, and wherein an outlet of the pump is fluidly coupled to the other one of the first fluid channel and second fluid channel; and a thermal unit fluidly coupled to one of the first fluid channel and second fluid channel, wherein the thermal unit comprises one or more of a heater and chiller configured to respectively heat and chill a fluid disposed within the first fluid channel and second fluid channel.

11. The thermal workpiece support system of claim 10, further comprising a controller configured to control a thermal transfer between the workpiece and the vessel based on a control of one or more of the pump and the thermal unit.

12. The thermal workpiece support system of claim 10, wherein the vessel further comprises an electrostatic clamp, wherein a clamping surface of the electrostatic clamp substantially defines the support surface.

13. The thermal workpiece support system of claim 10, wherein a fluid path is defined within the interior cavity, wherein the first taper and second taper provide a substantially constant mass flow of a fluid through the interior cavity.

* * * * *